United States Patent [19]

DePauw

[11] Patent Number: 5,709,930
[45] Date of Patent: Jan. 20, 1998

[54] COATED SUBSTRATE

[75] Inventor: Jean-Michel DePauw, Brussels, Belgium

[73] Assignee: Glaverbel, Brussels, Belgium

[21] Appl. No.: 517,768

[22] Filed: Aug. 22, 1995

[30] Foreign Application Priority Data

Aug. 24, 1994 [GB] United Kingdom ............ 94 17 112.1

[51] Int. Cl.$^6$ .................................................. C07C 17/34
[52] U.S. Cl. ................ 428/216; 428/336; 428/432; 428/697; 428/698; 428/699; 428/701; 428/702; 428/704
[58] Field of Search ................... 428/432, 698, 428/701, 697, 699, 702, 216, 336, 704

[56] References Cited

U.S. PATENT DOCUMENTS

| | | |
|---|---|---|
| 3,720,541 | 3/1973 | King ........................................ 117/211 |
| 4,775,203 | 10/1988 | Vakil et al. . |
| 4,780,372 | 10/1988 | Tracy et al. . |
| 5,106,671 | 4/1992 | Amberger et al. . |
| 5,170,291 | 12/1992 | Szczyrbowski et al. . |
| 5,201,926 | 4/1993 | Szczyrbowski et al. . |
| 5,271,960 | 12/1993 | Proscia . |

FOREIGN PATENT DOCUMENTS

| | | |
|---|---|---|
| 0368744 | 5/1990 | European Pat. Off. . |
| 0501632 | 9/1992 | European Pat. Off. . |
| 0520720 | 12/1992 | European Pat. Off. . |
| 0530676 | 3/1993 | European Pat. Off. . |
| 0536607 | 4/1993 | European Pat. Off. . |
| 0546302 | 6/1993 | European Pat. Off. . |
| 0548972 | 6/1993 | European Pat. Off. . |
| 1591064 | 6/1981 | United Kingdom . |
| 92/02364 | 2/1992 | WIPO . |

*Primary Examiner*—Archene Turner
*Attorney, Agent, or Firm*—Spencer & Frank

[57] ABSTRACT

A coated substrate, includes a substrate; at least one primary coating layer formed on the substrate; and a sputtered protective layer which is provided by cathode vacuum sputtering on an outermost coating layer of the at least one primary coating layer, which is exposed, which is composed of a material having a refractive index of less than 1.7 and comprising at least one substance selected from the group consisting essentially of oxides of silicon, oxynitrides of silicon, and mixtures of at least one of oxides of silicon, nitrides of silicon, and oxynitrides of silicon, and which has a thickness ranging from 1 to 10 nm, wherein the material of the sputtered protective layer additionally comprises not more than 10% by weight of a further substance which is one of an oxide of a silicon dopant or an oxynitride of a silicon dopant.

14 Claims, No Drawings

COATED SUBSTRATE

CROSS-REFERENCE TO RELATED APPLICATION

This application claims the priority of United Kingdom Patent Application No. 94 17 112.1 filed Aug. 24, 1994 and titled "Coated substrate and process for its formation", the subject matter of which is incorporated herein by reference.

BACKGROUND OF THE INVENTION

1. Field of the Invention

This invention is directed to a coated substrate comprising a substrate and at least one primary coating layer formed thereon and to a process of forming such a coated substrate.

Coated substrates find use in various fields for various purposes. Thus, for example, coated glass is used in mirrors, in decorative products and in solar screening panels, for use in buildings and vehicles. Commercially available solar screening panels are glass sheets carrying a single or a multi-coating, the outer coating layer being generally an oxide, nitride or metal coating such as titanium nitride, tin oxide, titanium oxide or chromium. These outer layers, especially when formed by vacuum deposition techniques, are very thin and are prone to chemical attack in use and/or are relatively sensitive to mechanical attack in use (resistance to abrasion for example).

2. Description of the Related Art

Coated substrates can be exposed to a number of conditions which tend to limit their useful life. During storage, transport and assembly into glazing units, such coated substrates are subjected to mechanical action which may result in the appearance of scratches or other imperfections. During exposure to the ambient atmosphere the coated samples may be subject to chemical action from pollutants in the atmosphere. Coatings may also be damaged by perspiration as a result of contact with the skin. Before being assembled into glazing units, it is common to wash the coated substrate with detergents, which may also damage the coating.

The durability of a given coating depends inter alia upon the composition of the coating and the method by which the various coating layers are deposited. In some cases the composition of the outer coating layer is such as to provide some improved durability. If it is desired to further improve durability by increasing the thickness of the outer coating layer, it is found that generally this results in changes in the optical properties of the sample outside acceptable tolerance ranges.

EP-A-0548972 describes a functional product, such as glass plate, carrying a thin functional layer and a composite layer of an oxide film, the oxide containing tin and silicon. The object of using the composite oxide film layer is to provide wear resistance to the product. The Examples all have a high proportion of tin in the composite layer (in a ratio of not less than 50:50 to the silicon), giving a relatively high refractive index (1.69 in most of the Examples, 1.75 in Example 3). The Examples also relate to relatively thick composite layers, from 5 nm (as in Example 8) to 93 nm (Example 3) and indeed it appears that deposition of relatively thick layers of the claimed composite material is necessary to achieve a reasonable degree of wear resistance. For instance the 5 nm thickness of the composite layer would seem to be the minimum to achieve a satisfactory protection of an adjacent layer against external corrosion.

Moreover the specific combination of tin and silicon oxides would seem to change the optical properties of the product to the extent that adjustment of the adjacent layers would be required to maintain the optical properties of the product as a whole. Accordingly the teaching of the said document does not meet the objective of protecting a surface layer on a glazing product without changing its optical properties.

SUMMARY OF THE INVENTION

It is an object of the present invention to provide coated substrates with improved chemical and/or mechanical durability, while minimising any consequential changes in the optical properties of the product.

We have now surprisingly found that this objective can be achieved by the provision of an outer coating of specific silicon compounds, applied in a specific manner.

Thus, according to a first aspect of the invention there is provided a coated substrate comprising a substrate and at least one primary coating layer formed thereon, characterised by an exposed protective additional layer, formed thereon by cathode vacuum sputtering, of a material with a refractive index of less than 1.7 and selected from oxides and oxynitrides of silicon, and mixtures of one or more of oxides, nitrides and oxynitrides of silicon, said protective layer having a thickness of from 1 to 10 nm.

According to a second aspect of the invention, there is provided a process for forming a coated substrate comprising forming at least one primary coating layer on a substrate, characterised by forming thereon by cathode vacuum sputtering an exposed protective additional layer of a material with a refractive index of less than 1.7 and selected from oxides and oxynitrides of silicon, and mixtures of one or more of oxides, nitrides and oxynitrides of silicon, said protective layer having a thickness of from 1 to 10 nm.

We have found that the protective layer improves the chemical and/or mechanical durability of the coated substrate. Particularly where the thickness of the protective layer is low, the effect thereof on the optical properties of the product may be minimal. This is particularly so when the material of the protective layer has a refractive index of less than 1.6. A material with a refractive index of less than 1.55 is especially advantageous, preferably of the order of 1.50 to 1.52, and even below 1.5.

The protective layer preferably has a thickness of from 2 to 5 nm. Below a thickness of about 2 nm, there is an improvement in durability, but this may not be sufficient to meet some commercial quality expectations. It is particularly surprising that significantly improved durability can be achieved with such thin coating layers of the silicon compound.

The invention is particularly beneficial where the primary coating layer adjacent the protective layer is selected from titanium nitride, tin oxide, zinc oxide, titanium oxide and chromium. Particular benefits arise with multi-coated substrates, which themselves have been deposited by sputtering. We have found that multi-coated substrates which include a metallic layer of silver or gold sandwiched between layers of metal oxide or nitride, also benefit from a thin protective coating layer of the silicon specified compounds.

The invention thus provides an improved quality of commercial coated vitreous products, in which the optical properties are well defined and subjected to strict manufacturing tolerances, by extending their lifespan without significantly changing their optical properties. The invention is especially advantageous in providing a layer which can protect all kinds of coatings, particularly coatings deposited by cathodic sputtering under vacuum, by improving their chemical resistance and/or mechanical resistance with little or no change in their optical properties. The invention thus provides a universally applicable protective layer, which is of great advantage particularly from the viewpoint of the industrial manufacture and reproducibility of several different types of coating in sequence in the same production unit.

Referring to multi-coated products containing silver, it should be noted that, for reasons concerning the cathode sputtering process, the silver is conventionally coated with a thin layer of a sacrificial metal (a "barrier" layer) which becomes converted to the oxide or nitride during the coating process. This sacrificial metal may be for example titanium, zinc, a nickel/chromium alloy or aluminium. A similar barrier layer may be placed below the silver layer. While these sacrificial layers provide some improvement in the durability of the product, improving chemical durability further by increasing the thickness of the sacrificial layers reduces the luminous transmission of the products. We have found that a protective coating layer of, for example 2 nm $SiO_2$, applied by cathode sputtering, can reduce the sensitivity to mechanical damage during storage and to humidity, reduce the sensitivity to perspiration on contact with the skin and improve the durability of the coating when the product is being washed with detergents prior to assembly for example in a double-glazing unit. A thicker $SiO_2$ layer may be applied, limited only by the permitted tolerances in optical properties of the product.

While not wishing to be bound by theory, the applicants believe that the thin coating layer according to the invention reduces the porosity of the underlying layer and thereby renders the product less sensitive to humidity and to the action of detergents. The thin layer of silicon compound is also believed to have a lubricating action, which assists in improving the mechanical durability of the product.

While known multi-coated substrates may be rendered more resistant by the replacement of the upper coating layer thereof by a coating layer of nitrides of silicon, especially the replacement of an outer $SnO_2$ layer having a thickness of less than 25 nm by silicon nitride, a further improvement in durability may be achieved according to the present invention by a thin coating layer of silica over the silicon nitride layer.

The protective layer is formed of a material selected from oxides and oxynitrides of silicon, and mixtures of one or more of oxides, nitrides and oxynitrides of silicon. That is, no other components are present in this layer, with the possible exception, if required for a sputtering process using silicon as the cathode (target), of up to 15% by weight, but preferably not more than 10%, of an oxide of a silicon dopant selected for example from aluminium, nickel, boron and phosphorus or other dopants, such as titanium or zirconium, or mixtures thereof, which leads to a layer having a refractive index less than 1.7. Ideally the material of the protective layer is silica, which term is used herein to mean any oxide of silicon, whether stoichiometrically $SiO_2$ or not. If a silicon cathode is used it is preferably as pure as possible, in order to obtain a layer of silica or $SiO_xN_y$ as pure as possible, and thus should contain no more dopant than the quantity necessary to give the required electrical conductivity for the deposition process employed.

The process according to the invention may be carried out by introducing the substrate into a processing chamber containing a silicon magnetron sputtering source, and provided with entry and outlet gas-locks, a conveyor for the substrate, power sources, sputtering gas inlets and an evacuation outlet. The silicon cathode contains a small amount of dopant, for example 5% of aluminium, to make it electrically conducting. The substrate is transported past the activated sputtering source and cold sputtered by oxygen gas to give a silicon oxide layer on the substrate.

As an alternative to the use of a silicon target cathode with a relatively large content of aluminum to give electrical conductivity, there can be employed a cathode having as high a silicon purity as possible, consistent with the electrical conductivity required by the deposition equipment and its manner of use, so as to obtain a silicon oxide layer as pure as possible and thus having a refractive index of less than 1.5, for example of the order of 1.46–1.48. Examples of such alternative target cathodes include monocrystalline silicon doped with boron to achieve a resistivity of about $10^{-2}$ ohm.cm, such as the silicon cathode doped with 65–400 ppm boron (i.e. >99.99% Si) with a resistivity of from $5.10^{-3}$ to $2.10^{-2}$ ohm.cm produced by Gesellschaft für Electrometallurgy (of D-90431 Nuremburg, Germany). Other examples employ silicon of at least 99.6% purity and in particular with 0.05% iron and 0.06% aluminium as dopants, obtained by plasma spraying, as produced by Vanderstraeten (of B-9800 Deinze, Belgium).

Preferably, the substrate comprises a vitreous material such as glass. Other substrate materials are possible, including plastic materials.

The coated substrate may be transparent or opaque, and in the latter case the primary coating layer or one of the primary coating layers may be a reflective coating layer.

The coated substrates may be used for a range of different purposes, such as glazing units of buildings, especially where the coated surface is exposed to the environment, and also exterior mirrors for vehicles, where again the coated surface is exposed.

DESCRIPTION OF THE PREFERRED EMBODIMENTS

The invention will now be described in more detail, with reference to the following non-limiting examples.

EXAMPLES 1 TO 9

The coating of a glass substrate with titanium nitride and silica (Example 1) was performed as follows.

A sheet of tempered glass having a thickness of 6 mm was introduced into a processing chamber containing two planar magnetron sputtering sources having targets respectively of silicon and titanium, and provided with entry and outlet gas-locks, a conveyor for the substrate, power sources, sputtering gas inlets and an evacuation outlet. The pressure in the chamber was reduced to $10^{-3}$ Pa. The silicon of the target cathode was doped with 5% aluminium to render it electrically conducting. The substrate was transported past the sputtering sources with the titanium source activated and cold sputtered by nitrogen gas at an effective depositing pressure of $3\times10^{-1}$ Pa to give a titanium nitride layer with a refractive index η=2.4, κ=1.4 at λ=550 nm and an geometric thickness of 22 nm, whereafter the titanium source was deactivated. In fact when later analyzed, this "titanium nitride" layer was found to contain a slight stoichiometric excess of titanium.

Nitrogen was purged from the system and oxygen was introduced at a pressure of $3\times10^{-1}$ Pa as sputtering gas. The silicon source was activated and the substrate transported past it to deposit a layer comprising silicon oxide having a geometric thickness of 3 nm and a refractive index of 1.52.

In a similar manner other coated substrates (A to 9) as set out in Table I below were prepared for comparison with substrates coated according to the invention.

The deposition of metal layers, for example of silver or titanium, is effected in an inert atmosphere (either nitrogen or argon for silver, but argon alone for titanium). Silicon nitride ($Si_3N_4$) is deposited from a silicon cathode (doped so as to be electrically conducting) in a reactive nitrogen atmosphere. ZnO and $SnO_2$ are obtained from a zinc cathode and tin cathode respectively, in a reactive oxygen atmosphere.

TABLE I

| Example | Coating layers (Thickness nm) |
|---|---|
| A* | TiN(22) |
| 1 | TiN(22)/$SiO_2$(3) |
| B* | TiN(22)/$SnO_2$(15) |
| 2 | TiN(22)/$SnO_2$(15)/$SiO_2$(3) |
| C* | TiN(22)/$Si_3N_4$(15) |
| 3 | TiN(22)/$Si_3N_4$(15)/$SiO_2$(3) |
| D* | ZnO(35)/Ag(10)/Ti(2)/ZnO(35) |
| 4 | ZnO(35)/Ag(10)/Ti(2)/ZnO(35)/$SiO_2$(2) |
| E* | $SnO_2$(12)/ZnO(23)/Ag(10)/Ti(2)/ZnO(23)/$SnO_2$(12) |
| 5 | $SnO_2$(12)/ZnO(23)/Ag(10)/Ti(2)/ZnO(23)/$SnO_2$(12)/$SiO_2$(2) |
| F* | ZnO(35)/Ag(10)/Zn(3)/ZnO(30) |
| 6 | ZnO(35)/Ag(10)/Zn(3)/ZnO(30)/$SiO_2$(1.5) |
| 7 | ZnO(35)/Ag(10)/Zn(3)/ZnO(30)/$SiO_2$(3) |
| G* | ZnO(35)/Ag(10)/Zn(3)/ZnO(15)/$SiO_2$(3)/ZnO(15) |
| 8 | ZnO(35)/Ag(10)/Zn(3)/ZnO(30)/$SiO_2$(10) |
| 9 | ZnO/$SnO_2$(35)/Ag(10)/Ti(3)/ZnO/$SnO_2$/ZnO(35)/$SiO_2$(5) |

*Comparative Example

These products were subjected to one or more of a variety of tests as described below, selected according to their intended applications.

(1) 7-day Cleveland test.

The "Cleveland" test consists of forming a glass chamber in which the sample forms the roof, with the coated surface facing inwardly. The chamber contains water at a temperature sufficient to provide water vapour at 50° C. in the immediate environment of the sample. The roof, being at a lower temperature, causes the formation of condensation of water vapour and the continuous streaming of water over the coated surface of the sample. The coated surface of the sample is then rubbed with a cloth to dry it. If it is removed by the cloth, the coating has not survived the test.

(2) 7-day salt fog test

The salt-fog test consists of spraying the samples with NaCl solution to subject them continuously to a salt fog at about 35° C.

(3) Sulphur test

The sample is surrounded with a sulphur dioxide atmosphere, thermostatically controlled to 40° C. in a closed chamber for 8 hours, opened for 16 hours and cycled in this manner for a total of 4 times 24 hours.

(4) Climatic test

The sample is surrounded by air in a chamber the temperature of which is cycled between 45° C. and 55° C. for periods of 1 hour for a total of 23 hours, followed by 1 hour at 25° C. and repeated for 7 days.

(5) "Lucite" test

In this test a sample of coated substrate having dimensions of at least 12 cm×25 cm is used. The sample is placed in a clamp with its test surface uppermost, sprinkled 100 g with "Lucite" (ex Du Pont de Nemours), a particulate material having a strictly controlled purity and granulometry and consisting of polymethylmethacrylate. A sheet of uncoated glass is then placed over the test surface. A reciprocating pressure plate carrying a weight of about 3.938 kg is then positioned on the assembly. The plate is reciprocated through 3000 cycles. After the test, the sample is removed and examined by transmission and reflection for scratches and fibrous markings.

(6) Washing Test

The sample to be tested is placed on a horizontal surface and has a drop of concentrated detergent (RBS 50 ex Chemical Products Belgium, rue Bollinckx 271-1190 Brussels) deposited thereon with the aid of a pipette. After a given period of time the drop of detergent is wiped away and the sample is examined by reflection. A poor result in this test is an indication that the product would develop defects if placed in a washing machine and which consequently may not be useful for applications which necessitate this treatment.

Results:

The results of the tests, demonstrating the benefit of the examples 1 to 9 according to the invention over the specified comparative examples A to 9 were as follows.

Example 1 passed the Cleveland test, the sulphur test and the Lucite test. On the other hand, Example A showed degradation of the coating at several places after the Cleveland test, and produced blurring after the sulphur test. After the Lucite test with Example A, several scratches were observed and the coating had lifted away from the substrate in some places.

The samples according to Examples 2 and 3 passed the Cleveland and salt fog tests. The sample according to Example B passed neither test. The sample according to Example C showed slight change in colour following the Cleveland test and resisted the salt-fog test. The colour comparison was made according to the Hunter method (R. S. Hunter, The Measurement of Appearance, John Wiley & Sons, NY, N.Y. 1975). The values of the Hunter co-ordinates L, a and b, measured either from the glass side or the coated side of the product, were established first for the coated substrate without the coating of the invention and then for the coated substrate with the coating of the invention. In the case of Examples B and 2, measured in reflection from the glass side, the Hunter values L, a and b were changed as follows:

$$L_{R_g}=44.7\% \rightarrow 45.1\%;\ a=-3.6 \rightarrow -3.7;\ b=-10.3 \rightarrow -10.1.$$

These variations in Hunter values are clearly less than differences observed from one point to another across the surface of a large sheet of glass upon which coatings are applied in series and are thus clearly within admissible manufacturing tolerances.

Example D has an luminous transmissivity $T_L$ of >85% and a normal emissivity <0.10. This product was subject to the Lucite test. After 3000 cycles the coating of Example D was found to be scratched. The same result is obtained if a 10 nm coating of $TiO_2$ is superimposed on the ZnO of Example D. Example 4 however, which included the additional silica protection layer, scratching of the coating was avoided, indicating that abrasion resistance had been improved while preserving the optical properties intact.

Example E resisted the Lucite test but is sensitive to humidity and to the detergent. When the sample according to Example E is subjected to the Washing test the coating is dissolved after 2 minutes. On the other hand, the sample according to Example 5 always resists the Washing test after 10 minutes.

Examples F and 6 to 8 were subjected to the same washing test as used for Examples E and 5. With Example F, having no silica protection layer, the coating was removed after 10 minutes. With Example G, where the protective layer of silica was covered with a further layer of zinc oxide, the coating was removed in the region of the detergent drop. The degradation of the coating was already noticeable after only 2 minutes with these two samples. Example 6, where the protective layer had a thickness of 1.5 nm, showed no removal of the coating after 10 minutes in 2 out of 3 repeats, indicating that in this example one is at the limit of protection for the coating. A comparison of Examples 7 and 8, where the protective layer had a thicknesses of 3 nm and 10 nm respectively showed that the latter showed a slight decoloration compared with the former, indicating the limit of acceptable change in optical properties had been reached.

Example 9 is a low emissivity glazing panel to which has been added a 5 nm protective layer of silica. After 1 day subjected to the salt fog test, this coating remains intact. Without the coating layer of silica, the same test causes the appearance of white spots in the coating. The silica layer does not significantly modify the dominant reflected wavelength, nor the purity of colour. The values of the Hunter co-ordinates L, a and b, measured in reflection from the coated side, changed from those for the coated substrate without the coating of the invention to those for the coated substrate with the Example 9 coating of the invention as follows:

$L_{Rc}=21.9\% \rightarrow 21.8\%$; $a=-2.2 \rightarrow -2.5$; $b=-5.1 \rightarrow 5.3$.

These variations again are clearly within admissible manufacturing tolerances.

EXAMPLES 10 AND 11

Using a method similar to that described in connection with Examples 1 to 9, other coated substrates were prepared as set out in Table II below. In these examples the cathode employed was formed of silicon doped with 10% aluminium.

TABLE II

| Example | Coating layers (Thickness nm) |
|---|---|
| H* | Cr(40)/SnO$_2$(85) |
| 10 | Cr(40)/SnO$_2$(85)/SiO$_2$(3) |
| I* | Cr(40) |
| 11 | Cr(40)/SiO$_2$(3) |

* = Comparative Example

An alcohol test was carried out on samples H and 10, consisting of vigorously wiping a cloth soaked in alcohol 50 times over the surface of the coating. There resulted a decoloration of the sample according to Example H, while the sample according to Example 10 remained intact.

Examples I and 11 were subjected to a "Taber" test which utilises a Taber Abraser (from Taber Abraser Testing Instruments) which comprises a rotating support table onto which the sample is fixed and on which a millstone is applied which rotates in a plane perpendicular to the support table. The millstone is of the type CS10F (rubber filled with abrasive grains) and is loaded to 500 g. The luminous transmission of the sample is observed before and after 300 rotations. The luminous transmission is 2% before the test for both Examples I and 11. After the test, an increase in luminous transmission is noticed, namely 3.3% for Example I but only 2.5% for Example 11, with scratches being less noticeable.

EXAMPLE 12 & COMPARATIVE EXAMPLES J & K

Again using a method similar to that described in connection with Examples 1 to 9, other coated substrates were prepared so as to provide a comparison with the teaching of EP-A-0548972. In Example 12 the cathode employed was formed of substantially pure silicon (the cathode being obtained from Gesellschaft für Electrometallurgy).

| Example | Coating layers (Thickness nm) |
|---|---|
| J* | [glass]/TiN(24) |
| K* | [glass]/TiN(24)/Sn:Si oxides [50:50](5) |
| 12 | [glass]/TiN(24)/SiO$_2$(5) |

* = Comparative Example

Example J represents the base product. It had luminous transmissivity ($T_L$) of 29.16% and luminous reflectivity ($R_L$) of 13.8%. The values of its Hunter co-ordinates a and b, measured in reflection from the glass side, were −0.75 and −9.7 respectively.

Example K is a product according to EP-A-0548972. It had luminous transmissivity ($T_L$) of 29.57% and luminous reflectivity ($R_L$) of 14.8%. The values of its Hunter co-ordinates a and b, measured in reflection from the glass side, were −1.15 and −10.4 respectively. Such variations in optical properties, added to variations arising in the course of manufacture, change the optical properties to a greater extent than the admissible manufacturing tolerances. These tolerances are imposed to ensure a consistent product quality and depend strongly on the product characteristics. In this case the tolerances are as follows: $T_L \pm 1.2\%$, $R_L \pm 0.51\%$, $a \pm 0.2$ and $b \pm 0.4$. The Example K results for $R_L$, a and b fall outside these limits.

The equivalent results for Example 12 were: luminous transmissivity ($T_L$) of 29.42% and luminous reflectivity ($R_L$) of 14.3%. The values of its Hunter co-ordinates a and b, measured in reflection from the glass side, were −0.95 and −10.0 respectively. These are within the manufacturing tolerances of the base product.

It can also be noted that a 3 nm layer of the 50:50 Sn:Si oxide material according to EP-A-0548972 is not enough to achieve any significant improvement in the durability of the coated base material, whereas 3 nm of silica (SiO$_2$) ensures good protection which improves the durability of the product and protects the base coating against wear caused by handling and transportation.

EXAMPLE 13

Again using a method similar to that described in the previous examples an anti-solar panel having a silver layer was given a protective coating according to the invention.

Example

Coating layers (Thickness nm)

[glass]/ZnO(40)/Ag(22)/Ti(3)/(ZnO/SnO$_2$/ZnO)(65)/SiO$_2$(5)   13

The properties of the so-coated panel were compared with the panel prior to coating with SiO$_2$. The luminous transmissivity ($T_L$) of the SiO$_2$-coated panel was about 1% less than the SiO$_2$-free panel and its solar factor (FS) was unchanged. The luminous reflectivity ($R_L$) changed from 40.7% (SiO$_2$-free) to 41.5% (SiO$_2$-coated). The values of its Hunter co-ordinates L, a and b, measured in reflection from the glass side, were changed as follows (SiO$_2$-free to SiO$_2$-coated):

$L_{Rc}=63.8\% \rightarrow 64.4\%$; $a=-2.3 \rightarrow -2.5$; $b=2.7 \rightarrow -2.3$.

These changes are within the manufacturing tolerances of the product. The SiO$_2$ layer significantly improves the durability of the product. In the Washing Test in the absence of the $SiO_2$ layer a deterioration was observed in the colour of the base layer, whereas there was no discoloration when the $SiO_2$ layer was present.

What is claimed is:

1. A coated substrate, comprising:

a substrate;

at least one primary coating layer formed on the substrate; and a sputtered protective layer which is provided by cathode vacuum sputtering on an outermost coating layer of the at least one primary coating layer, which is exposed, which is composed of a material having a refractive index of less than 1.7 and comprising at least one substance selected from the group consisting essentially of oxides of silicon, oxynitrides of silicon, and mixtures of at least one of oxides of silicon, nitrides of silicon, and oxynitrides of silicon, and which has a thickness ranging from 1 to 10 nm, wherein the material of the sputtered protective layer additionally comprises not more than 10% by weight of a further substance which is one of an oxide of a silicon dopant or an oxynitride of a silicon dopant.

2. The coated substrate according to claim 1, wherein the material of the sputtered protective layer has a refractive index of less than 1.6.

3. The coated substrate according to claim 2, wherein the material of the sputtered protective layer has a refractive index of less than 1.55.

4. The coated substrate according to claim 1, wherein the sputtered protective layer has a thickness which ranges from 2 to 5 nm.

5. The coated substrate according to claim 1, wherein the outermost coating layer of the at least one primary coating layer is comprised of a substance selected from the group consisting essentially of titanium nitride, tin oxide, zinc oxide, titanium oxide, and chromium.

6. The coated substrate according to claim 1, wherein the material of the sputtered protective layer is $SiO_2$.

7. The coated substrate according to claim 1, wherein the substrate comprises glass.

8. The coated substrate according to claim 1, wherein the coated substrate is transparent.

9. The coated substrate according to claim 1, wherein the coated substrate is opaque.

10. The coated substrate according to claim 9, wherein the at least one primary coating layer includes a reflective coating layer.

11. The coated substrate according to claim 1, wherein the coated substrate has only one sputtered protective layer.

12. The coated substrate according to claim 1, wherein the silicon dopant is selected from the group consisting essentially of aluminum, nickel, boron and phosphorous.

13. The coated substrate according to claim 12, wherein the sputtered protective layer has a thickness which does not exceed 3 nm.

14. The coated substrate according to claim 12, wherein the sputtered protective layer has a thickness which ranges from 2 to 3 nm.

* * * * *